United States Patent [19]

Bamberger

[11] Patent Number: 5,118,488
[45] Date of Patent: Jun. 2, 1992

[54] PROCESS FOR MAKING WHISKERS, FIBERS AND FLAKES OF TRANSITION METAL COMPOUNDS

[75] Inventor: Carlos E. Bamberger, Oak Ridge, Tenn.

[73] Assignee: Martin Marietta Energy Systems, Inc., Oak Ridge, Tenn.

[21] Appl. No.: 573,748

[22] Filed: Aug. 28, 1990

[51] Int. Cl.$^5$ .............................................. C01B 21/06
[52] U.S. Cl. .................................... 423/409; 423/411; 156/600; 156/603; 156/DIG. 75; 156/DIG. 99; 156/DIG. 112; 501/96
[58] Field of Search ................ 423/409, 411; 156/600, 156/603, DIG. 112, DIG. 75, DIG. 99; 501/96

[56] References Cited

U.S. PATENT DOCUMENTS

| | | | |
|---|---|---|---|
| 2,461,018 | 2/1949 | Alexander | 423/411 |
| 4,515,763 | 5/1985 | Boudart et al. | 423/409 |
| 4,888,084 | 12/1989 | Nixdorf et al. | 423/411 |
| 4,975,260 | 12/1990 | Imai et al. | 423/411 |
| 5,002,646 | 3/1991 | Egerton et al. | 423/411 |

FOREIGN PATENT DOCUMENTS

| | | | |
|---|---|---|---|
| 63-248800 | 10/1988 | Japan | 156/DIG. 112 |
| 63-252928 | 10/1988 | Japan | 156/600 |
| 2-221126 | 9/1990 | Japan | 423/409 |

*Primary Examiner*—Robert Kunemund
*Attorney, Agent, or Firm*—Joseph A. Marasco; Harold W. Adams

[57] ABSTRACT

A process for making titanium and chromium nitrides of known morphology by reacting potassium titanate and chromium oxide in the gas phase with $NH_3$. The products exhibit the same morphology as the starting material.

3 Claims, No Drawings

PROCESS FOR MAKING WHISKERS, FIBERS AND FLAKES OF TRANSITION METAL COMPOUNDS

This invention relates to a process for making whiskers, fibers and flakes of transition metal compounds, in particular titanium nitride and chromium nitride, and was developed under United States Department of Energy contract number DE-AC05-84OR21400.

BACKGROUND

Whiskers are single crystals that have a high length to width ratio. When incorporated into the matrix of materials such as ceramics, the result can be a composite having improved strength and toughness. A great deal of research is being done in this area to improve the performance of ceramics in applications such as cutting tools, turbine parts and internal combustion engine parts.

Whiskers made of titanium nitride are of interest since the compound has a high melting point of 2950° C., a hardness of 8-9 in Moh's scale, exhibits good electrical conductance and is stable at high temperatures in inert atmospheres. However, to date the processes for making TiN whiskers have almost exclusively required a gas phase reaction between $TiCl_4$, $N_2$ and $H_2$ at temperatures above 1000° C., with the attendant problems of controlling the gas flow rate and the disposal of the HCl by-product. These processes are not only very expensive due to the extreme conditions required, but they also result in low product yields.

Only recently have alternative methods for TiN synthesis been reported. Three reactions that have been developed are molten cyanide with sodium-titanium bronze; oxide-containing molten alkali cyanide with TiN powder or $TiO_2$; and molten alkali cyanides with alkali titanates. These reactions take place in the liquid phase yielding a product of whose whisker morphology cannot always be consistently repeated. There is a need for a process that would yield a product having a morphology that can be anticipated and consistently repeated.

SUMMARY OF THE INVENTION

In view of the above stated needs, it is an object of this invention to provide a process for making whiskers, fibers and flakes of transition metal compounds that yields a product having a morphology that can be anticipated.

It is another object of this invention to provide a process for making transition metal compounds that provides a product that has the same shape as the starting material.

A further object of the invention is to provide a topochemical process for the formation of transition compounds shaped as whiskers, fibers and flakes.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the process of this invention may comprise mixing a compound having particles of known morphology, said compound selected from the group consisting of potassium titanate and potassium chromate, with $NH_3$ at a temperature of about 1000° C. for from about 24 to about 72 hours resulting in the production of a nitride compound having particles in the same morphology as the starting material. The advantage of this invention is that one can begin with a starting material having particles of a known form and be assured that the morphology will remain in the final product.

DETAILED DESCRIPTION OF THE PREFERRED EMBODIMENT

The selection of the starting material for this process is a critical element of this invention. The examples presented here use whiskers and flakes (or platelets) as starting material, the choice depending on the form that is desired for the product. Since the reaction is topochemical, that is it starts on the surface of the solid, the shape of the particle is not disturbed from starting material to final product.

To obtain the starting material potassium titanate ($K_2Ti_6O_{13}$, $K_2Ti_4O_9$ or $K_2Ti_6O_5$) in the form of whiskers a number of processes are available. One way is to melt $TiO_2$ and $K_2CO_3$ (molecular ratio of 3:1) at 1000° C., cool quickly with water and then wash with water until the water is faintly alkaline. Another reaction is to heat $TiO_2$ and $K_2CO_3$ (molecular ratio 5 or 6:1) to 1000° C., cool, grind and reheat several times. The resulting $K_2Ti_6O_{13}$ is then placed with an excess (about 1:10 by weight) of an about equimolar mixture of KF and KCl at 1200° C. for 30 to 60 minutes. After cooling slowly, the K-halides are extracted with hot water until there is no Cl-reaction with $AgNO_3$ solution. A variation of this reaction is to add $TiO_2$ and $K_2CO_3$ to the KF-KCl mixture and heat at 1200° C. for 1 hour. Another variation is to add only $TiO_2$ to the KF-KCl mixture and let the air in the furnace provide the oxygen by means of the reaction

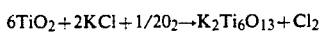

$$6TiO_2 + 2KCl + 1/2O_2 \rightarrow K_2Ti_6O_{13} + Cl_2$$

The starting material $K_2Ti_6O_{13}$ is then reacted with $NH_3$ to produce TiN whiskers or fibers. Since the size and morphology of crystals grown from melts is relatively easy to control by methods known to persons of ordinary skill in the art, for instance by controlling the cooling rate, it follows that it should be easy to control the size and shape of the resulting TiN whiskers. It appears that a heterogeneous topochemical reaction occurs whereby, surprisingly, potassium is volatilized in some form, probably as KOH.

The above preparations of starting material were made in platinum containers and the resulting products were obtained as thick disks or cakes of whiskers. The cakes were scraped in water to suspend the whiskers which were then collected and compacted by filtration in dies of different shapes or as a wool like material. The chemical composition of $K_2Ti_6O_{13}$ was established by X-ray diffraction (XRD), its morphology observed by microphotography using a scanning electron microscope (SEM) and the whiskers were confirmed to be whiskers (single crystals) by electron diffraction (ED).

The composition and process described in the following example is intended to be illustrative and not in any way a limitation on the scope of the invention. Persons of ordinary skill in the art should be able to envision variations on the general principle of this invention that fall within the scope of the generic claims the follow.

EXAMPLE 1

Portions of starting material were contained in crucibles of different materials, such as $Al_2O_3$, Ni and graphite, which were placed in vertical nickel reactors attached to Pyrex tops. The latter had openings for a thermocouple well, gas inlet and outlet. The preferred crucible material is graphite or vitreous carbon. After displacing the air with $N_2$ or Ar, $NH_3$ either pure or diluted with those gases was flown through the system for different periods of time at various temperatures. From several experiments it was concluded that pure $NH_3$, a reaction temperature of 1000° C. and a reaction time of 24 to 72 hours were the preferred parameters under the geometrical conditions of this rection. The configuration of the experiment does not appear to be important in regard to conversion; for a good rate of conversion, what is necessary is a good contact between the $NH_3$ and the $K_2Ti_6O_{13}$. The techniques used to characterize the $K_2Ti_6O_{13}$ whiskers (XRD, SEM and ED) were employed to characterize the resulting TiN whiskers, and showed that the morphology had remained unchanged. Other experiments were performed in which a densely packed disk or cake of $K_2Ti_6O_{13}$ whiskers was converted in situ into a densely packed disk or cake of TiN whiskers.

EXAMPLE 2

Dark green platelets of $Cr_2O_3$ were obtained by decomposition of $K_2CrO_4$ at 900° C. The platelets were separated by filtration after dissolving the $K_2CrO_4$ by-product in water. Using the same experimental procedure as described in Example 1, about 0.5 g of the $Cr_2O_3$ platelets were exposed to flowing $NH_3$ gas at 900° C. for a total of 60 hours. Metallic looking, shiny flakes were obtained; the measured weight loss of 13.23% agreed well with the value of 13.15% calculated for the conversion of $CrO_{1.5}$ to CrN. X-ray diffraction confirmed that the flakes consisted of pure CrN. SEM of the flakes of $Cr_2O_3$ and CrN showed that their morphology remained unchanged.

The subject invention can be used to prepare high quality transition metal nitride whiskers, flakes and fibers which may be useful for toughening ceramics and other appropriate matrices. Suggested uses of the invention are for valves that are exposed to slurries, for heat engines and prehaps as cutting tools. Ceramic composites are the subject of much industrial activity and it is expected that this invention will have application in that area of technology.

I claim:

1. A process for making nitrides of known morphology comprising the steps of:
    a. providing chromium oxide particles of known morphology; and,
    b. mixing said chromium oxide particles with $NH_3$ at a sufficient temperature for sufficient time to result in the production of a chromium nitride composition having particles of the same morphology as said chromium oxide particles.

2. The process of claim 1 wherein said temperature is about 1000° C.

3. The process of claim 1 wherein said time is from about 24 to 72 hours.

* * * * *